(12) United States Patent
Kister

(10) Patent No.: US 7,649,367 B2
(45) Date of Patent: Jan. 19, 2010

(54) LOW PROFILE PROBE HAVING IMPROVED MECHANICAL SCRUB AND REDUCED CONTACT INDUCTANCE

(75) Inventor: January Kister, Portola Valley, CA (US)

(73) Assignee: MicroProbe, Inc., Carlsbad, CA (US)

( * ) Notice: Subject to any disclaimer, the term of this patent is extended or adjusted under 35 U.S.C. 154(b) by 330 days.

(21) Appl. No.: 11/635,809

(22) Filed: Dec. 6, 2006

(65) Prior Publication Data
US 2008/0265873 A1 Oct. 30, 2008

Related U.S. Application Data

(60) Provisional application No. 60/748,438, filed on Dec. 7, 2005.

(51) Int. Cl.
*G01R 1/06* (2006.01)
(52) U.S. Cl. .......................... 324/754; 324/762
(58) Field of Classification Search ........................ None
See application file for complete search history.

(56) References Cited

U.S. PATENT DOCUMENTS

| | | | |
|---|---|---|---|
| 5,015,947 A * | 5/1991 | Chism | 324/754 |
| 5,145,384 A * | 9/1992 | Asakawa et al. | 439/78 |
| 5,832,601 A | 11/1998 | Eldridge et al. | |
| 6,027,630 A | 2/2000 | Cohen | |
| 6,218,203 B1 | 4/2001 | Khoury et al. | |
| 6,278,284 B1 | 8/2001 | Mori et al. | |
| 6,441,315 B1 | 8/2002 | Eldridge et al. | |
| 6,482,013 B2 | 11/2002 | Eldridge et al. | |
| 6,677,245 B2 | 1/2004 | Zhou et al. | |
| 6,707,311 B2 | 3/2004 | Hohenwarter | |
| 6,917,525 B2 | 7/2005 | Mok et al. | |
| 6,956,389 B1 | 10/2005 | Mai | |
| 7,150,658 B1 * | 12/2006 | Chien et al. | 439/700 |
| 7,202,682 B2 | 4/2007 | Cooper et al. | |
| 7,218,127 B2 | 5/2007 | Cooper et al. | |
| 2003/0027423 A1 | 2/2003 | Zhou et al. | |
| 2005/0189958 A1 | 9/2005 | Chen et al. | |

\* cited by examiner

*Primary Examiner*—Vinh P Nguyen
(74) *Attorney, Agent, or Firm*—Samantha A. Updegraff; Peacock Myers, P.C.

(57) ABSTRACT

A vertically folded probe is provided that can provide improved scrub performance in cases where the probe height is limited. More specifically, such a probe includes a base and a tip, and an arm extending from the base to the tip as a single continuous member. The probe arm is vertically folded, such that it includes three or more vertical arm portions. The vertical arm portions have substantial vertical overlap, and are laterally displaced from each other. When such a probe is vertically brought down onto a device under test, the probe deforms. During probe deformation, at least two of the vertical arm portions come into contact with each other. Such contact between the arm portions can advantageously increase the lateral scrub motion at the probe tip, and can also advantageously reduce the probe inductance.

15 Claims, 5 Drawing Sheets

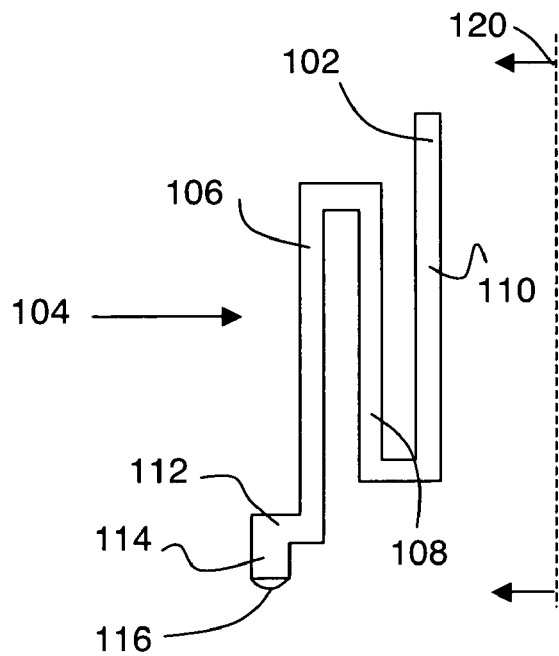
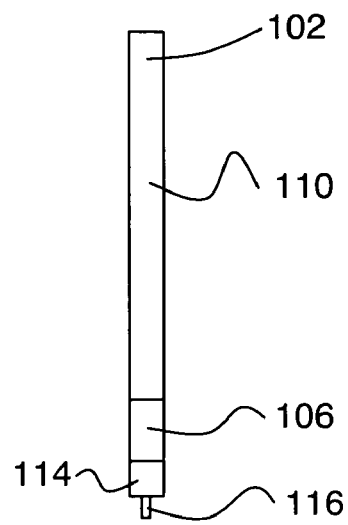
Fig. 1a  Fig. 1b
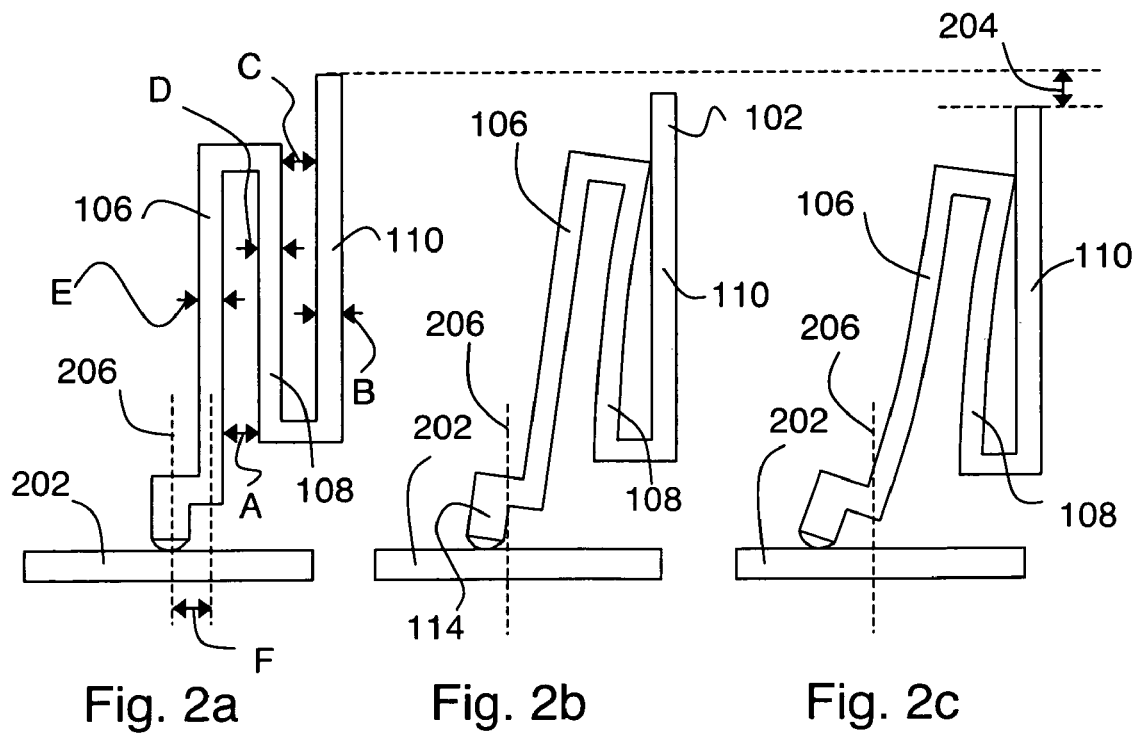
Fig. 2a  Fig. 2b  Fig. 2c

LOW PROFILE PROBE HAVING IMPROVED MECHANICAL SCRUB AND REDUCED CONTACT INDUCTANCE

CROSS REFERENCE TO RELATED APPLICATIONS

This application claims the benefit of U.S. provisional application 60/748,438, filed on Dec. 7, 2005, entitled "Micro-Fabricated Low Profile Probe", and hereby incorporated by reference in its entirety.

FIELD OF THE INVENTION

The present invention relates to probes for making electrical contact to a device under test (DUT).

BACKGROUND

Probes for making electrical contact to a device under test (DUT) are typically resilient devices that deform in a controllable manner in use. Probe deformation can perform various functions, such as providing a suitable scrub motion between probe tip and contact pad to facilitate making a reliable electrical contact. The shape of a probe has a significant effect on its deformation properties, and accordingly many kind of probe shapes have been considered in the art. Representative examples of known probe shapes include U.S. Pat. Nos. 6,707,311, 6,482,013, 6,278,284, 5,832,601, 6,956,389, 6,677,245, and US 2003/0027423.

Various probe fabrication methods have been employed to make such probes. One of these methods is referred to as micro-fabrication, and entails building up a probe (or probe array) by deposition of appropriately patterned layers having probe material and sacrificial material, such that eventual removal of the sacrificial material exposes the fabricated probe(s). Micro-fabrication approaches typically impose an overall height limit on the fabricated probe. A typical height limit for micro-fabrication is on the order of 0.8 mm. The existence of some such limit is unsurprising, since deposition of an unlimited number of layers is unlikely to be practical.

Probes provided by micro-fabrication have been considered in the art. Examples include the probes of US 2005/0189958, U.S. Pat. No. 6,917,525, 6,218,203, and U.S. Pat. No. 6,027,630, where several zigzag and folded probe geometries are considered. Many of these probe designs can be regarded as a scaling of known probe geometries to comply with the vertical height limit of probe micro-fabrication.

However, we have found that such scaling of known probe geometries to comply with the height limit of probe micro-fabrication tends to provide probes having unfavorable performance characteristics. In particular, it is difficult to obtain sufficient lateral scrub motion from conventional probe geometries scaled to comply with a height limit on the order of 0.8 mm.

Accordingly, it would be an advance in the art to provide a probe geometry for providing improved lateral scrub motion while complying with a vertical height limit.

SUMMARY

According to the invention, a vertically folded probe can provide improved scrub performance in cases where the probe height is limited. More specifically, such a probe includes a base and a tip, and an arm extending from the base to the tip as a single continuous member. The probe arm is vertically folded, such that it includes three or more vertical arm portions. The vertical arm portions have substantial vertical overlap, and are laterally displaced from each other. When such a probe is vertically brought down onto a device under test, the probe deforms. During probe deformation, at least two of the vertical arm portions come into contact with each other. Such contact between the arm portions can advantageously increase the lateral scrub motion at the probe tip, and can also advantageously reduce the probe inductance.

BRIEF DESCRIPTION OF THE DRAWINGS

FIGS. 1a-b show two views of a probe according to an embodiment of the invention.

FIGS. 2a-c show a probe according to an embodiment of the invention in various deformation conditions.

DETAILED DESCRIPTION

Figure 3A:
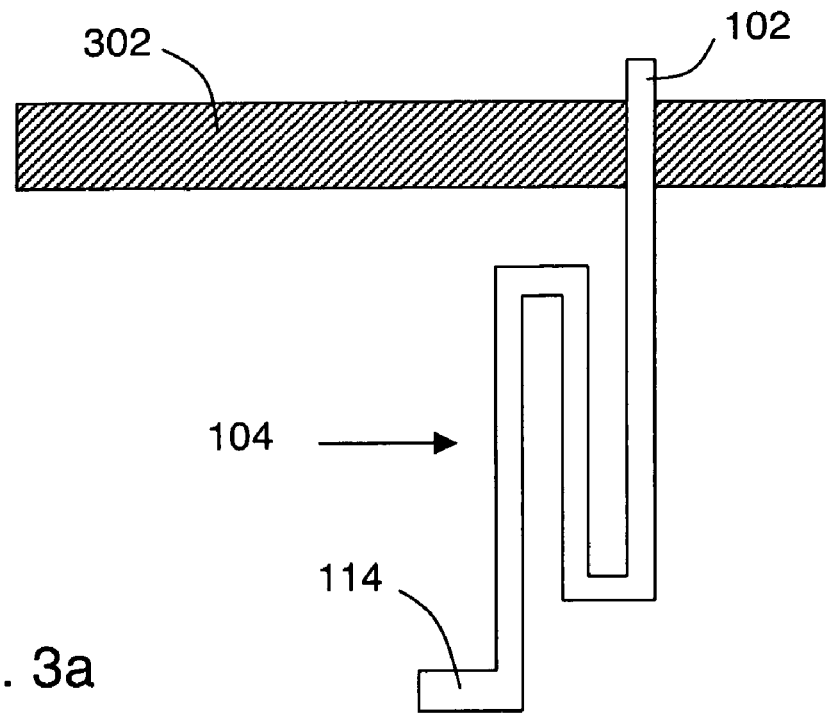
FIGS. 3a-b show two exemplary options for mounting probes according to an embodiment of the invention.

FIGS. 1a-b show two views of a probe according to an embodiment of the invention. The probe includes a probe base 102, a probe tip 114, and an arm 104 extending from probe base 102 to probe tip 114 as a continuous member. Arm 104 includes three or more vertical arm portions, which in this example are labeled as 106, 108, and 110. The vertical arm portions are substantially parallel to a direction of relative motion between probe and DUT as contact is made. The vertical arm portions are laterally displaced from each other, as shown. Finally, the vertical arm portions have a substantial vertical overlap with each other, also as shown. The net effect of these geometrical constraints is to ensure that arm 104 is folded vertically from base 102 to tip 114, as opposed to being folded horizontally between base 102 and tip 114. FIG. 1b shows a view of the probe of FIG. 1a as seen from view 120.

Optionally, probe arm 104 can include a lateral termination 112, on which probe tip 114 is located. Also optionally, probe tip 114 can include a reduced width protrusion 116 to facilitate making electrical contact.

FIGS. 2a-c show a probe according to an embodiment of the invention in various deformation conditions. FIG. 2a shows an initial contact configuration when the probe first makes contact to a contact pad (or bump) 202. Throughout this description, "vertical" refers to the direction of relative motion between contact pad 202 and probe base 102 as contact is made. Dashed line 206 shows this direction on FIGS. 2a-c, and it is also apparent that vertical arm portions 106, 108, and 110 are parallel to dashed line 206 in the undeformed state of FIG. 2a. Once initial contact is made, the contact pad and probe base are brought closer to each other by a predetermined vertical distance referred to as the overtravel 204. The resulting probe motion and deformation is conveniently referred to as contact motion. For any particular probe design, there is a one-to-one relation between overtravel and contact force (which may be linear or nonlinear), so either parameter can be used to quantify the contact motion.

In the initial stages of the contact motion, gap C becomes narrower as the contact motion proceeds, and eventually vertical arm portions 108 and 110 make contact as shown on FIG. 2b. During this phase of the contact motion, the probe tip mainly rocks on the contact pad, with relatively little lateral displacement, as shown on FIG. 2b. Once gap C is closed, gap A increases as the contact motion proceeds. During this phase of the contact motion, the probe tip continues to rock, and has relatively large lateral displacement, as shown on FIG. 2c. On FIGS. 2a-c, vertical line 206 is laterally positioned at the point of first contact between the probe and contact pad 202, so motion of the probe tip away from line 206 is a lateral scrub motion.

This specific probe deformation can provide significant advantages. A first advantage is that a relatively large lateral scrub motion can be achieved in a probe configuration having a relatively small total vertical height. It is important that the scrub motion be sufficient to effectively remove oxide and other impediments to reliable electrical contact. In one design example, a lateral scrub of 50 μm or more was achieved with a probe configuration having a total height on the order of 0.8 mm (i.e., consistent with a typical micro-fabrication height limit). The total length of the vertically folded probe arm in this example was 1.5 mm.

A second advantage is that the contact formed between vertical arm portions 108 and 110 on FIGS. 2b-c can provide a current path from probe base 102 to probe tip 114 having reduced inductance. Reducing the inductance of the probe advantageously improves the AC bandwidth and current carrying capability.

The amount of lateral scrub provided by the probe of FIGS. 2a-c can be altered by varying the probe geometry. For example, increasing gap C tends to decrease the lateral scrub motion. Scrub motion tends to increase as the lateral separation between probe tip 114 and probe base 102 increases. Gaps A and C can be varied to set the lateral offset, and the lateral termination length F, if a lateral termination 112 is present, can also be varied to set the lateral offset. The beam thicknesses B, D, and E determine the contact force for a given probe geometry and overtravel distance. Typical parameter working ranges are as follows: A and C from about 25 μm to about 100 μm; B, D, and E from about 25 μm to about 150 μm; and F from about 25 μm to about 50 μm. Typical contact forces are about 2 grams (force) or greater. Typical vertical overtravels are about 40 μm or greater, and preferably are about 50 μm or greater. It is also preferred for the probe thickness perpendicular to the probe plane to be somewhat higher than the nominal in-plane probe thickness, so that deformation of the probe is easiest in the probe plane. More specifically, the out of plane thickness is preferably between about 1.1 $h_{nom}$ and about 1.5 $h_{nom}$, where $h_{nom}$ is a nominal in-plane probe thickness, and is typically equal or approximately equal to B, D, and E.

Probes according to the invention can be fabricated from any mechanically resilient and electrically conductive material. Suitable materials for probe base 102, probe arm 104 and probe tip 114 are well known in the art, and any such materials can be employed in practicing the invention. Suitable tip materials are electrically conductive and wear-resistant, and include Rh and Cr. As indicated above, the invention can be especially advantageous in connection with micro-fabrication, but probes according to the invention can be fabricated via any probe fabrication method. Suitable methods include, but are not limited to, standard multi-layer metal deposition techniques such as plating and sputtering; photolithographic techniques; micro-fabrication and microelectromechanical systems (MEMS) techniques.

Figure 3B:
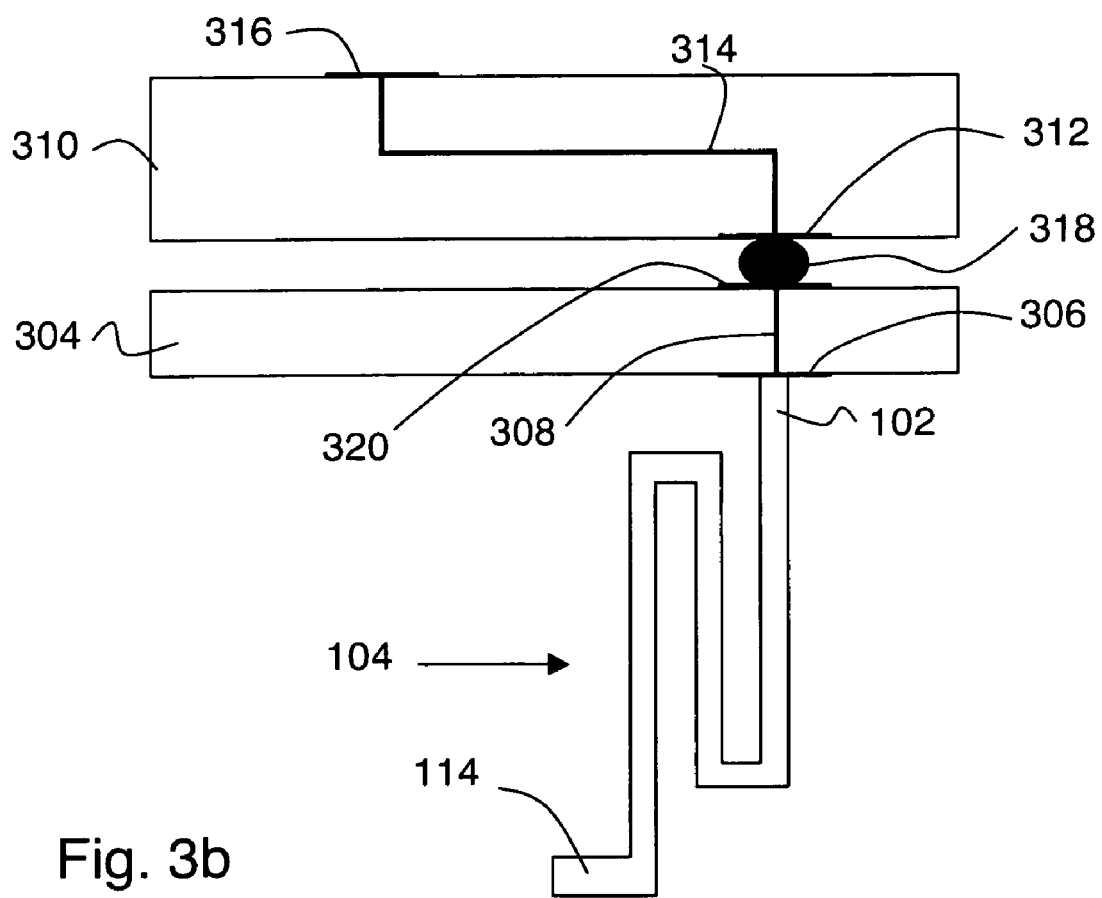

FIGS. 3a-b show two exemplary options for mounting probes according to an embodiment of the invention. FIG. 3a shows a mounting arrangement where probe base 102 is held in a clamping plate or fixture 302. FIG. 3b shows a mounting arrangement suitable for use in connection with micro-fabricated probes. In this example, the probe (including probe base 102, probe arm 104 and probe tip 114) is plated up from a metallized pad 306 on a ceramic carrier 304. The probe-to-pad and pad-to-carrier junctions have high mechanical strength. A via 308 passes through carrier 304 and connects contact pad 306 to another contact pad 308. An assembly of one or more probes on carrier 304 can be connected to a space transformer 310 via solder bumps such as 318. The space transformer 310 provides vias such as 314 connecting input pads such as 312 to output pads such as 316. The use of a space transformer 310 to facilitate making electrical contact to densely packed arrays of probes is well known in the art.

A key point of this example is that the mechanical stresses arising from probe deformation do not reach solder bump 318, which tends to be mechanically weak. Instead, these stresses reach the junction between probe base 102 and pad 306 and the junction between pad 306 and carrier 304, and both junctions can have mechanical strength comparable to that of the probe itself. By ensuring that mechanical stress from probe deformation does not reach the solder bumps, mechanical reliability can be improved.

Figure 4:
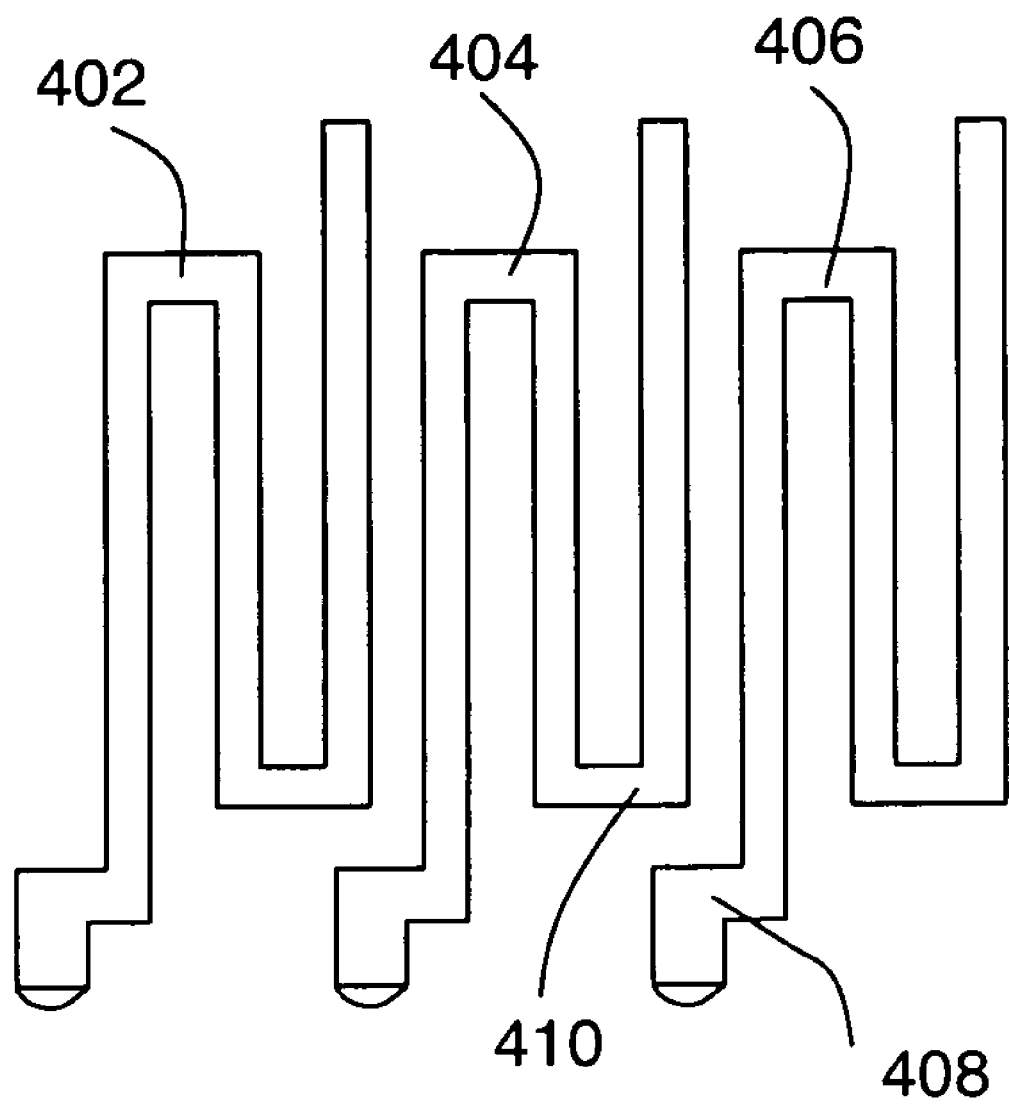
FIG. 4 shows an embodiment of the invention having multiple overlapping probes.

FIG. 4 shows an embodiment of the invention having multiple overlapping probes, 402, 404, and 406. As indicated above, probe arrays are commonly employed in practice, and it is often necessary to minimize the separation between probes, e.g., in order to probe densely packed arrays of contact pads. In embodiments of the invention where a lateral termination at the probe tip is employed to provide an additional lateral offset at the probe tip (e.g., as shown on FIGS. 1a-b and 2a-c), the probes of a probe array can overlap as shown on FIG. 4. More specifically, the lateral termination 408 of a first probe 406 can fit under a portion of the arm 410 of a second probe 404. In a probe array, it is important to ensure that no two probes come into contact with each other as each probe performs its contact motion, e.g., by providing adequate separation between probes.

Figure 5A:
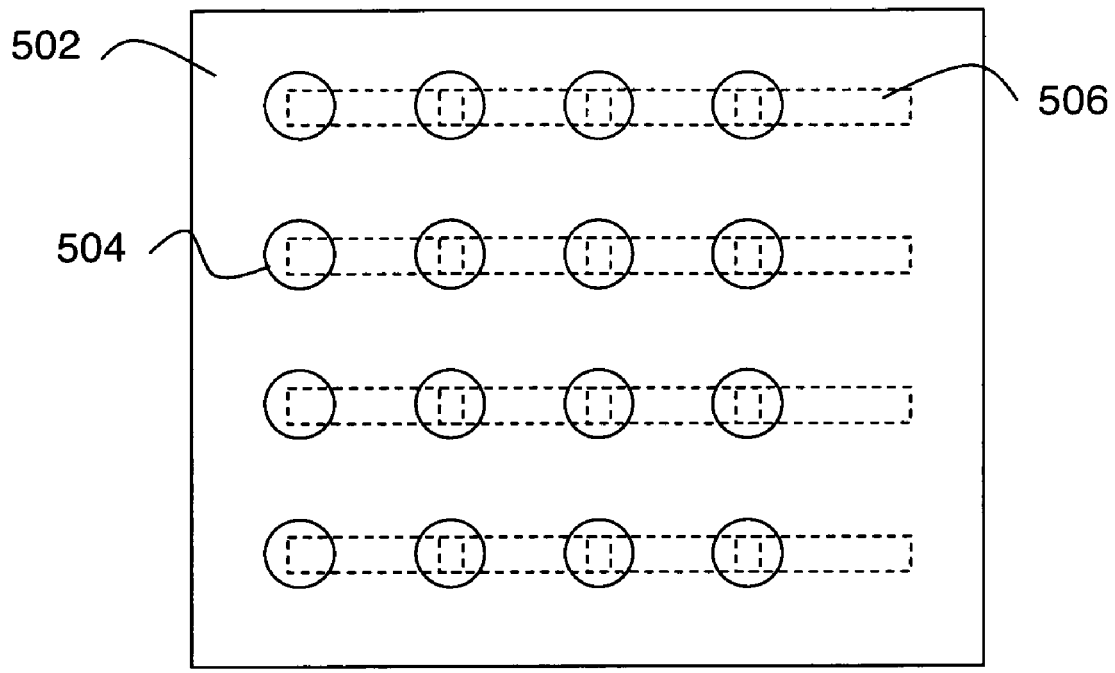
FIGS. 5a-b show embodiments of the invention having probes orthogonally and diagonally aligned with respect to an array of contact pads.
Figure 5B:
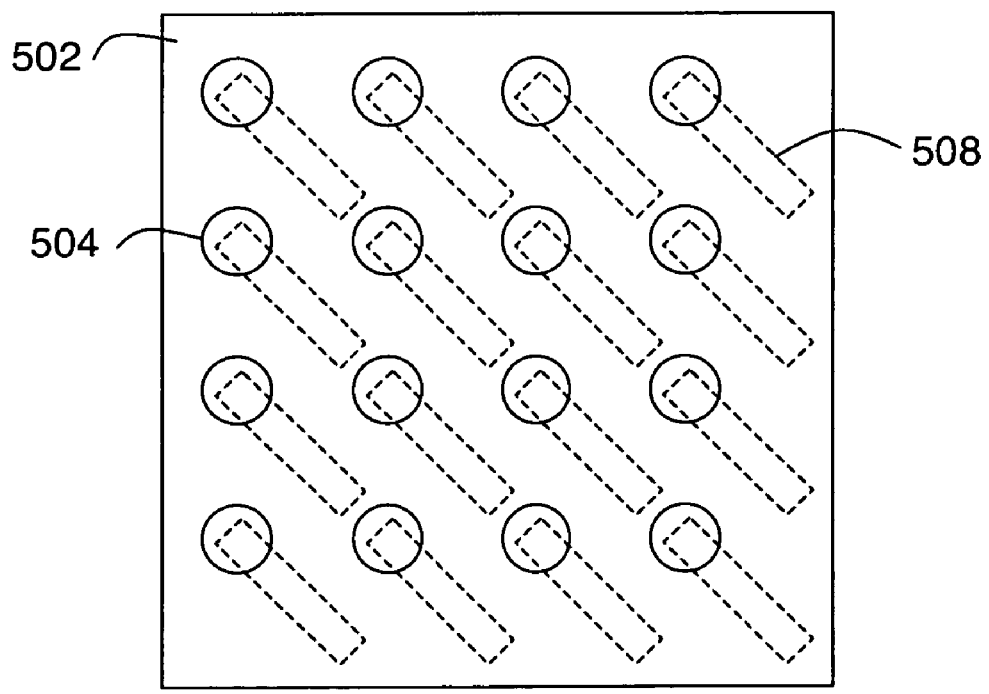

FIGS. 5a-b show embodiments of the invention having probes orthogonally and diagonally aligned with respect to an array of contact pads. FIGS. 5a-b are top views of a DUT 502 having an array of contact bumps, one of which is referenced as 504. From the top, probes as in the previously described embodiments of the invention (i.e., substantially planar probes) have a rectangular outline. On FIG. 5a, an array of probes, one of which is referenced as 506, corresponds to the array of contact bumps. In this example, the probes are aligned orthogonally with respect to the contact bump array. The probes in this example are shown as overlapping, and contact between probes can be avoided by employing the kind of probe overlap shown on FIG. 4.

In cases where a dense array of contact bumps is to be probed, it is preferred for the probe array to have probes which are disposed diagonally with respect to the contact bump array, e.g., as shown on FIG. 5b. One probe of the array is referenced as 508. In the examples of FIGS. 5a-b, the contact bump spacing and the probe size are the same, while the probe separation is larger on FIG. 5b than on FIG. 5a as a result of the diagonal arrangement of the probes. Therefore, the contact pad separation can be substantially decreased on FIG. 5b compared to FIG. 5a (e.g., until the probe overlap on FIG. 5b is the same as on FIG. 5a). Thus, a diagonal arrangement of probes can provide probing of more densely spaced contact bump arrays than an orthogonal arrangement of probes, other parameters being equal. Angles other than 45 degrees can also be employed, depending on the contact bump layout, to enable probing of densely packed contact bumps.

Figure 6:
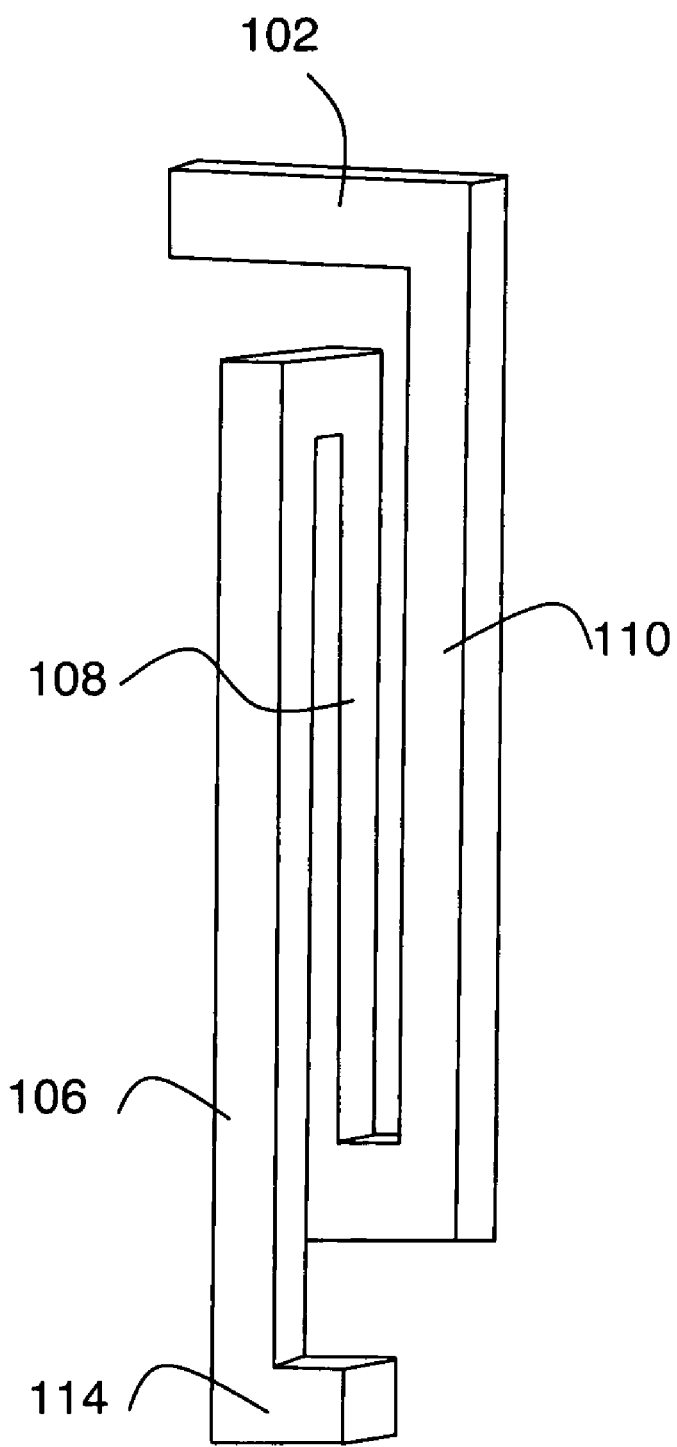
FIG. 6 shows a probe according to an embodiment of the invention having non-coplanar vertical arm portions.

FIG. 6 shows a probe according to an embodiment of the invention having non-coplanar vertical arm portions. More specifically, arm portions 106, 108, and 110 are not disposed in a common plane, in contrast with prior-described examples of the invention where arm portions 106, 108, and 110 are disposed in a common plane. Such an embodiment of the invention provides another approach for providing increased probe density for probing dense arrays of contact pads. The top view outline of the probe of FIG. 6 can be more square than rectangular, which can facilitate closer packing of the probes. The geometry of an apparatus in which the probes are used may affect the choice between planar and non-planar probes.

The invention claimed is:

1. A probe for making electrical contact to a device under test (DUT), the probe comprising:
    a) a probe base;
    b) a probe tip;
    c) an arm extending from the probe base to the probe tip as a continuous member, wherein the arm includes three or more vertical arm portions;
    wherein the vertical arm portions are substantially parallel to a direction of relative motion between the probe and the DUT as contact is made between the probe and the DUT, wherein the vertical arm portions are laterally displaced from each other, and wherein the vertical arm portions have a substantial vertical overlap with each other;
    wherein at least two of the vertical arm portions come into contact with each other as contact is made between the probe and the DUT with a predetermined vertical overtravel.

2. The probe of claim 1, wherein a length of said arm is about 1.5 mm.

3. The probe of claim 1, wherein said arm includes a lateral termination and wherein said probe tip is located on said lateral termination.

4. The probe of claim 1, wherein said probe tip has a reduced-width protrusion for making said electrical contact.

5. The probe of claim 1, wherein a contact force corresponding to said predetermined vertical overtravel is more than 2 grams.

6. The probe of claim 5, wherein said predetermined vertical overtravel is at least 40 μm.

7. The probe of claim 1, wherein said predetermined vertical overtravel is accompanied by a lateral scrub motion of said probe tip relative to said device under test.

8. The probe of claim 1, wherein said three or more vertical arm portions are not disposed in a common plane.

9. The probe of claim 1, wherein said three or more vertical arm portions are disposed in a common plane.

10. The probe of claim 1, wherein a reduced inductance electrical current path from said probe base to said probe tip is established as said at least two of the vertical arm portions come into contact with each other.

11. Apparatus including probes for making electrical contact to a device under test (DUT), each of the probes comprising:
    a) a probe base;
    b) a probe tip;
    c) an arm extending from the probe base to the probe tip as a continuous member, wherein the arm includes three or more vertical arm portions;
    wherein the vertical arm portions are substantially parallel to a direction of relative motion between the probe and the DUT as contact is made between the probe and the DUT, wherein the vertical arm portions are laterally displaced from each other, and wherein the vertical arm portions have a substantial vertical overlap with each other;
    wherein at least two of the vertical arm portions come into contact with each other as contact is made between the probe and the DUT with a predetermined vertical overtravel.

12. The apparatus of claim 11, wherein, for each of said probes, said arm includes a lateral termination on which said probe tip is located.

13. The apparatus of claim 12, wherein said probes are arranged such that said lateral termination of a first of said probes fits under a portion of said arm of a second of said probes.

14. The apparatus of claim 13, wherein said first probe and said second probe do not come into contact with each other as said contact is made with said predetermined vertical overtravel.

15. The apparatus of claim 11, wherein said device under test comprises an array of contact bumps and wherein each of said probes is substantially planar and is disposed substantially diagonally with respect to the array of contact bumps.

* * * * *

UNITED STATES PATENT AND TRADEMARK OFFICE
CERTIFICATE OF CORRECTION

| | | |
|---|---|---|
| PATENT NO. | : 7,649,367 B2 | Page 1 of 1 |
| APPLICATION NO. | : 11/635809 | |
| DATED | : January 19, 2010 | |
| INVENTOR(S) | : January Kister | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 374 days.

Signed and Sealed this

Twenty-third Day of November, 2010

David J. Kappos
*Director of the United States Patent and Trademark Office*